(12) United States Patent
Schmidt

(10) Patent No.: US 9,595,135 B2
(45) Date of Patent: Mar. 14, 2017

(54) TECHNIQUE FOR MAPPING A TEXTURE ONTO A THREE-DIMENSIONAL MODEL

(71) Applicant: AUTODESK, INC., San Rafael, CA (US)

(72) Inventor: Ryan Michael Schmidt, Toronto (CA)

(73) Assignee: AUTODESK, INC., San Rafael, CA (US)

( * ) Notice: Subject to any disclaimer, the term of this patent is extended or adjusted under 35 U.S.C. 154(b) by 303 days.

(21) Appl. No.: 13/786,296

(22) Filed: Mar. 5, 2013

(65) Prior Publication Data
US 2014/0253548 A1    Sep. 11, 2014

(51) Int. Cl.
| | |
|---|---|
| *G09G 5/00* | (2006.01) |
| *G06T 17/10* | (2006.01) |
| *G06F 17/50* | (2006.01) |
| *G06T 11/00* | (2006.01) |
| *G06T 15/04* | (2011.01) |
| *G06T 19/00* | (2011.01) |

(52) U.S. Cl.
CPC ............ *G06T 17/10* (2013.01); *G06F 17/50* (2013.01); *G06T 11/001* (2013.01); *G06T 15/04* (2013.01); *G06T 19/00* (2013.01)

(58) Field of Classification Search
CPC ........ G06T 15/04; G06T 15/50; G06T 19/321
See application file for complete search history.

(56) References Cited

U.S. PATENT DOCUMENTS

| | | | | |
|---|---|---|---|---|
| 5,488,684 | A  * | 1/1996  | Gharachorloo et al. | 345/423 |
| 5,555,356 | A  * | 9/1996  | Scheibl | G06T 17/20 |
| | | | | 345/423 |
| 8,253,754 | B2 * | 8/2012  | Snyder et al. | 345/582 |
| 2004/0171922 | A1* | 9/2004  | Rouet et al. | 600/407 |
| 2005/0128211 | A1* | 6/2005  | Berger et al. | 345/582 |
| 2009/0304280 | A1* | 12/2009 | Aharoni et al. | 382/180 |
| 2010/0119120 | A1* | 5/2010  | Bronstein et al. | 382/113 |
| 2011/0187720 | A1* | 8/2011  | Pedersen | 345/442 |
| 2011/0293165 | A1* | 12/2011 | Malon et al. | 382/133 |
| 2012/0063655 | A1* | 3/2012  | Dean et al. | 382/128 |

OTHER PUBLICATIONS

Non-Final Office Action for U.S. Appl. No. 13/786,269 dated May 11, 2015.

\* cited by examiner

*Primary Examiner* — Phi Hoang
(74) *Attorney, Agent, or Firm* — Artegis Law Group, LLP

(57) ABSTRACT

A stroke parameterization engine within a rendering engine is configured to map a texture to the surface of a three-dimensional (3D) model along a stroke defined by an end-user of the rendering engine. The stroke parameterization engine converts the stroke to a polyline, then generates a geodesic trace by sliding a geodesic circle along the polyline and collecting points associated with the 3D model that fall within the geodesic circle. The stroke parameterization engine then parameterizes points associated with the polyline and the geodesic trace using UV coordinates associated with a texture map, thereby generating UV coordinates for each point within the polyline and geodesic trace. The stroke parameterization engine then projects the texture map onto the surface of the 3D model using the UV coordinates generated for the polyline and geodesic trace.

20 Claims, 10 Drawing Sheets

TECHNIQUE FOR MAPPING A TEXTURE ONTO A THREE-DIMENSIONAL MODEL

BACKGROUND OF THE INVENTION

Field of the Invention

The present invention generally relates to computer graphics and, more specifically, to a technique for mapping a texture onto a three-dimensional model.

Description of the Related Art

A conventional rendering application may be used to generate a three-dimensional (3D) model of an object. The object could be a real-world object, such as a human being or an animal, or a virtual object, such as a video game character. The 3D model of the object typically includes a mathematical representation of the volume and/or surface of the object, and may include a polygonal mesh, a point cloud, a wireframe model, a manifold, or other such mathematical representations. Conventional rendering applications are often capable of projecting a texture map onto the surface of the 3D model in order to cause the surface of the 3D model to appear more physically realistic when rendered for display.

Conventional rendering applications may project texture maps onto the surface of 3D models using a variety of different techniques. For example, one such technique allows the user of the rendering application to indicate a sequence of locations on the surface of the 3D model where a texture map should be applied. The rendering application would then apply the texture map to that sequence of locations. However, with this approach, a conventional rendering application simply projects multiple overlapping copies of the texture map across the surface of the 3D model at the different locations in the sequence. Since texture maps are typically square, the aforementioned technique usually creates an unrealistic looking pattern consisting of multiple overlapping squares that have a discontinuous-looking texture.

As the foregoing illustrates, what is needed in the art is a more effective technique for projecting a texture map onto the surface of a 3D model.

SUMMARY OF THE INVENTION

One embodiment of the invention includes a computer-implemented method for projecting a texture map onto a three-dimensional (3D) model, including generating a polyline that includes a first plurality of points that resides along a stroke path defined across a surface region of the 3D model, generating a geodesic trace that includes a second plurality of points that resides within a threshold distance of the polyline, generating a UV coordinate for each point included in the first plurality of points and for each point included in the second plurality of points, and projecting the texture map onto the surface region of the 3D model according to the UV coordinates for each point included in the first plurality of points and the UV coordinates for each point included in the second plurality of points.

One advantage of the disclosed technique is that a texture is able to be mapped across the surface of the 3D model along the stroke specified by the end-user, thereby producing a continuous-looking texture along that stroke.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
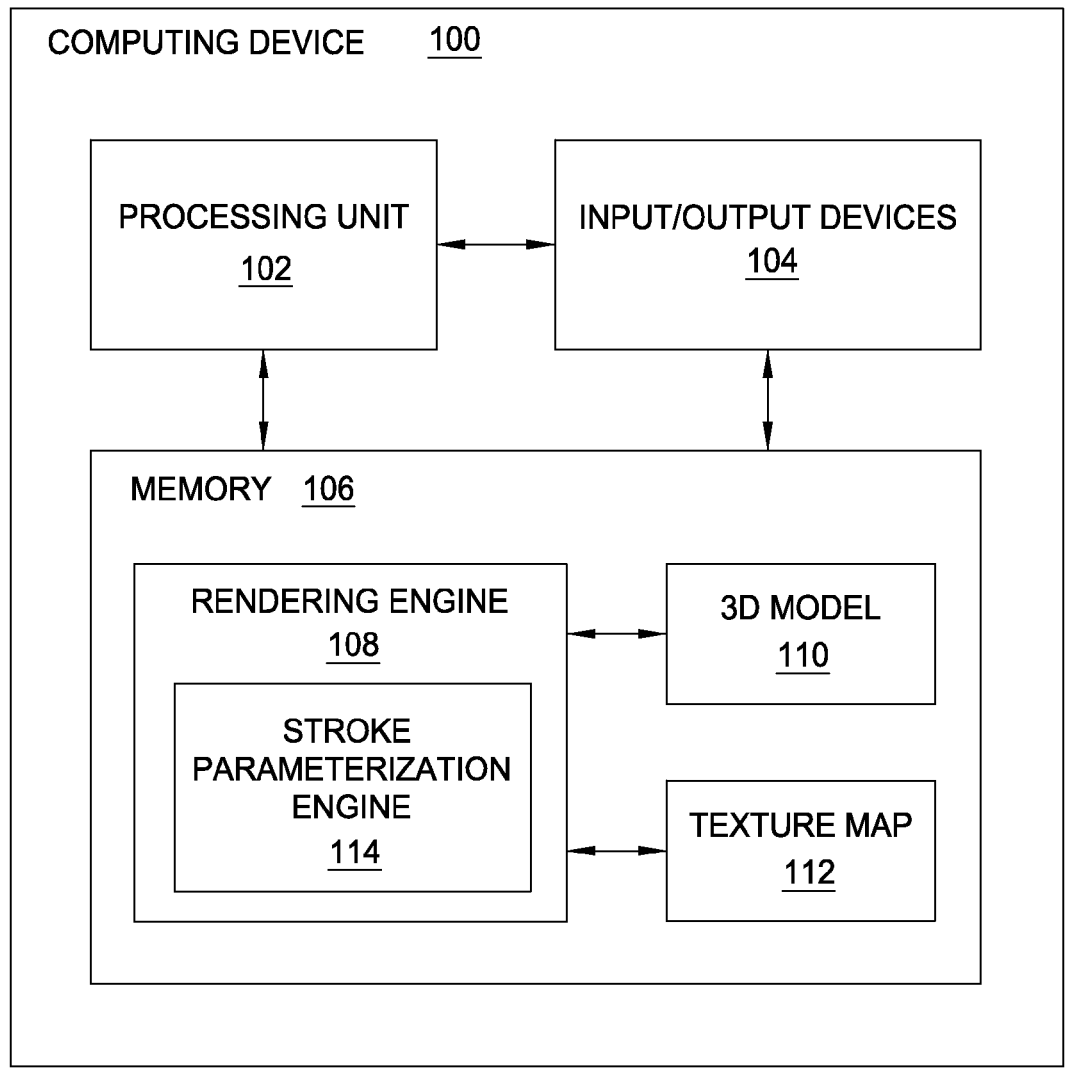
FIG. 1 illustrates a computing device configured to implement one or more aspects of the present invention.

FIG. 1 illustrates a computing device 100 configured to implement one or more aspects of the present invention. As shown, computing device 100 includes a processing unit 102 coupled to input/output (I/O) devices 104 and to a memory 106. Processing unit 102 may be a central processing unit (CPU), a graphics processing unit (GPU), or a combination of different processing units, such as a CPU configured to operate in conjunction with a GPU. In general, processing unit 102 may be any technically feasible hardware unit capable of processing data and/or executing software applications.

I/O devices 104 are also coupled to memory 106 and may include devices capable of receiving input, such as a keyboard, a mouse, a video camera, a three-dimensional (3D) scanner, and so forth, as well as devices capable of providing output, such as a display device, a speaker, and so forth. Additionally, I/O devices may include devices capable of both receiving input and providing output, such as a touchscreen, a universal serial bus (USB) port, and so forth. I/O devices 104 may be configured to receive various types of input from an end-user of computing device 100, and to also provide various types of output to the end-user of computing device 100.

Memory 106 is configured to store data and may include a hard disk, a random access memory (RAM) module, a flash memory unit, or any other type of memory unit or combination thereof. Processing unit 102 and I/O devices 104 are configured to read data from and write data to memory 106. Memory 106 includes a rendering engine 108, a three-dimensional (3D) model 110, and a texture map 112. 3D model 110 may be any technically feasible type of mathematical model, including a polygonal mesh, a point cloud, a wireframe model, a manifold, and so forth. Rendering engine 108 is a software application that may be executed by processing unit 102, and is configured to generate and/or modify 3D model 110. Rendering engine 108 may also be configured to generate a graphical user interface (GUI) that provides to an end-user various tools for editing 3D model 110. Texture map 112 is a two-dimensional (2D) image that defines a texture, and generally includes a set of texture (UV) coordinates that define the texture at various points on a set of UV axes.

Rendering engine 108 is configured to apply texture map 112 to portions of the surface of 3D model 110 by mapping individual UV coordinates associated with texture map 112 to corresponding surface (XYZ) coordinates associated with the surface of 3D model 110. Rendering engine 108 is also configured to implement a stroke parameterization engine 114 that maps UV coordinates associated with texture map 110 to a region surrounding a "stroke," such as, e.g., a brushstroke, disposed along the surface of 3D model 110.

In practice, the stroke may be generated based on input received from the end-user. For example, the end-user could select a paintbrush tool from the GUI generated by rendering engine 108, and then paint the stroke on the surface of the 3D model. Stroke parameterization engine 114 is configured to parameterize the stroke using the UV coordinates associated with texture map 112, and to then estimate UV coordinates for various portions of the model proximate to the stroke. Stroke parameterization engine 114 may then project texture map 112 onto the surface of 3D model 110 using those estimated UV coordinates, as discussed in greater detail below in conjunction with FIGS. 2A-5B and 7-9. Stroke parameterization engine 114 is also configured to identify various features associated with 3D model 110 that reside proximate to the stroke disposed on the surface of 3D model 110, as discussed in greater detail below in conjunction with FIGS. 6A-6B and 9.

Figure 2A:
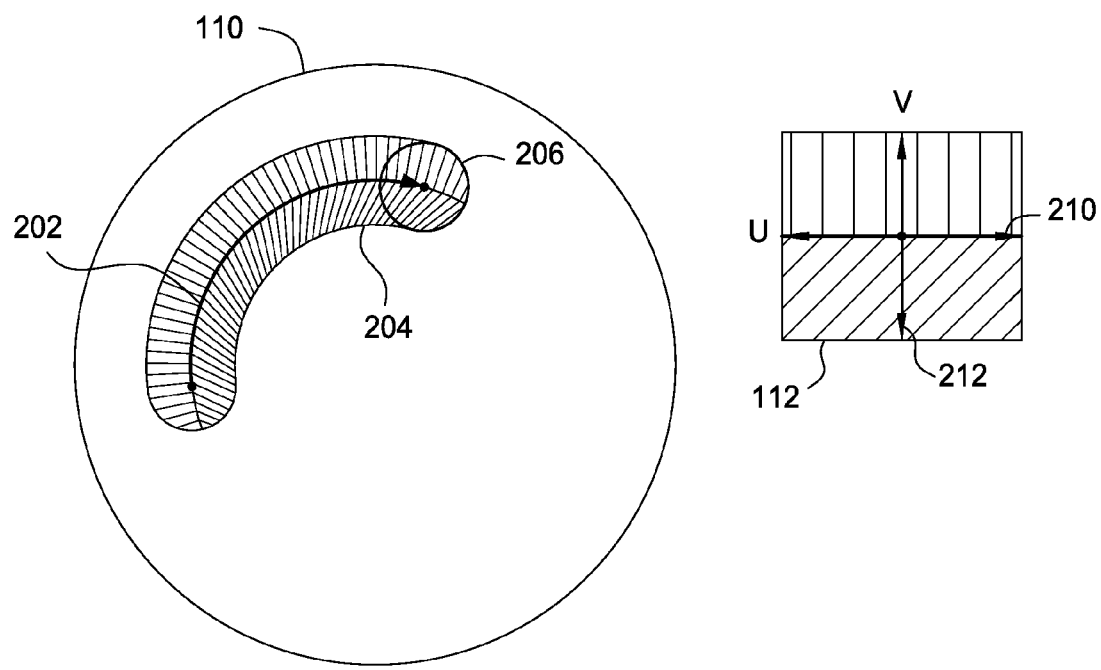
FIG. 2A is a conceptual diagram that illustrates a texture map projected onto a geodesic trace on the surface of a 3D model, according to one embodiment of the present invention.

FIG. 2A is a conceptual diagram that illustrates texture map 112 projected onto a geodesic trace 204 on the surface of 3D model 110, according to one embodiment of the present invention. As shown, stroke 202 is disposed on the surface of 3D model 110. Stroke 202 defines a 3D polyline that follows a geodesic associated with the surface of 3D model 110. As also shown, geodesic trace 204 defines a region proximate to stroke 202. The end-user of rendering engine 108 may interact with the GUI provided by rendering engine 108 in order to draw or paint stroke 202 on the surface of 3D model 110, as mentioned above in conjunction with FIG. 1.

Stroke parameterization engine 114 may generate geodesic trace 204 by sliding a geodesic circle 206 along stroke 202 and identifying portions of 3D model 110 (such as, e.g., vertices or points, etc.) that fall within geodesic circle 206. Geodesic circle 206 could be, for example, a circle that resides approximately tangent to the surface of 3D model 110 at different points associated with stroke 202. Stroke parameterization engine 114 is configured to project texture map 112 onto geodesic trace 204 along stroke 202. In doing so, stroke parameterization engine 114 is configured to parameterize stroke 202 and geodesic trace 204 along a U axis 210 and a V axis 212 associated with texture map 112, thereby generating UV coordinates for each point included within geodesic trace 204, as discussed in greater detail below in conjunction with FIG. 2B.

Figure 2B:
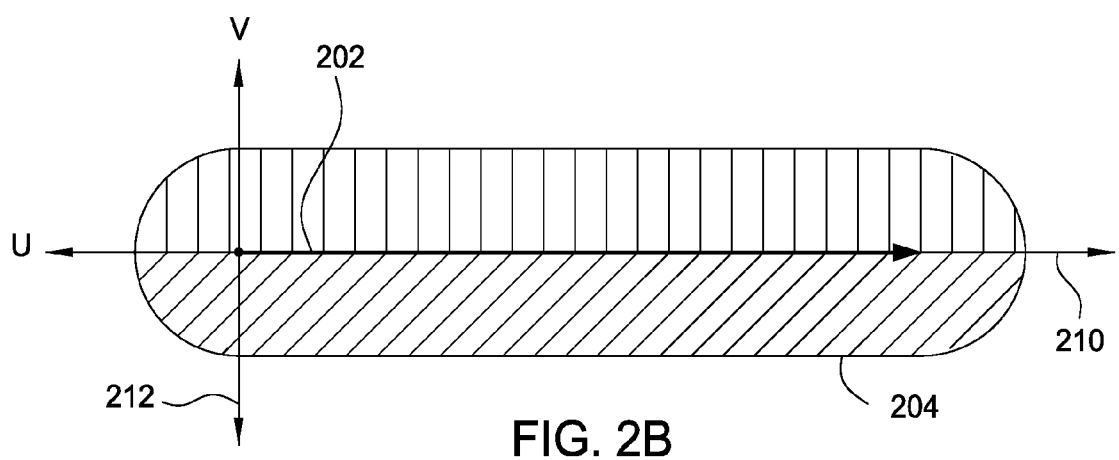
FIG. 2B is a conceptual diagram that illustrates the geodesic trace shown in FIG. 2A parameterized with UV coordinates, according to one embodiment of the present invention.

FIG. 2B is a conceptual diagram that illustrates stroke 202 and geodesic trace 204 shown in FIG. 2A parameterized with UV coordinates, according to one embodiment of the invention. As shown, stroke 202 and geodesic trace 204 are parameterized along U axis 210 and V axis 212 associated with texture map 112 (also shown in FIG. 2A). Stroke parameterization engine 114 is configured to parameterize stroke 202 so that stroke 202 resides along U axis 210. Stroke parameterization engine 114 is configured to parameterize geodesic trace 204 in similar fashion, i.e. along U axis 210. Stroke parameterization engine 114 may use any technically feasible parameterization technique to convert the 3D surface coordinates associated with stroke 202 and geodesic trace 204 into the 2D coordinates associated with texture map 112.

Figure 3A:
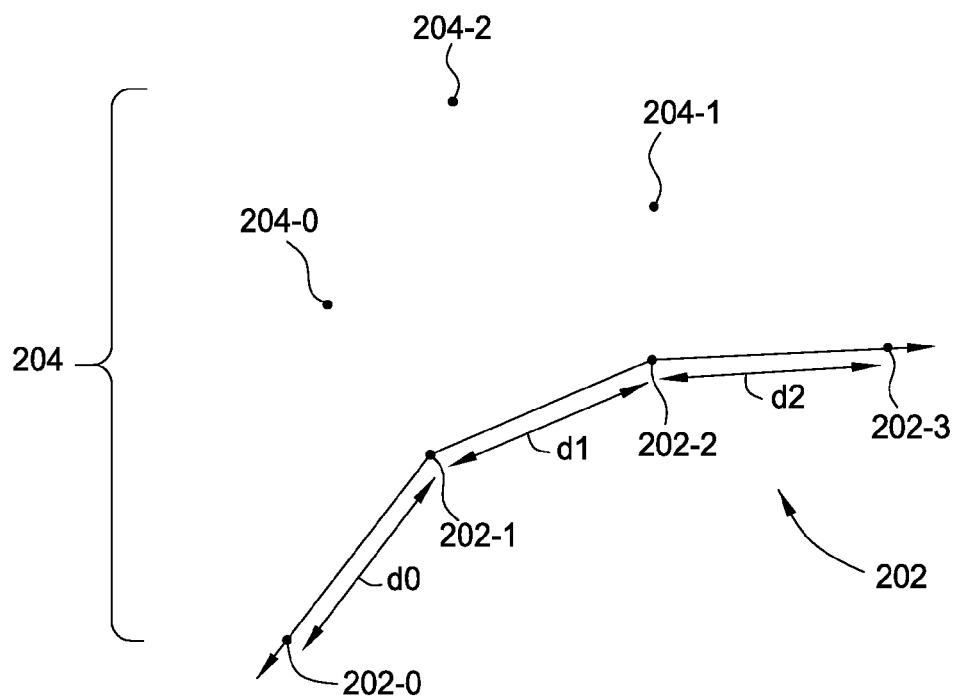
FIG. 3A is a conceptual diagram that illustrates the geodesic trace shown in FIG. 2A in greater detail, according to one embodiment of the present invention.
Figure 3B:
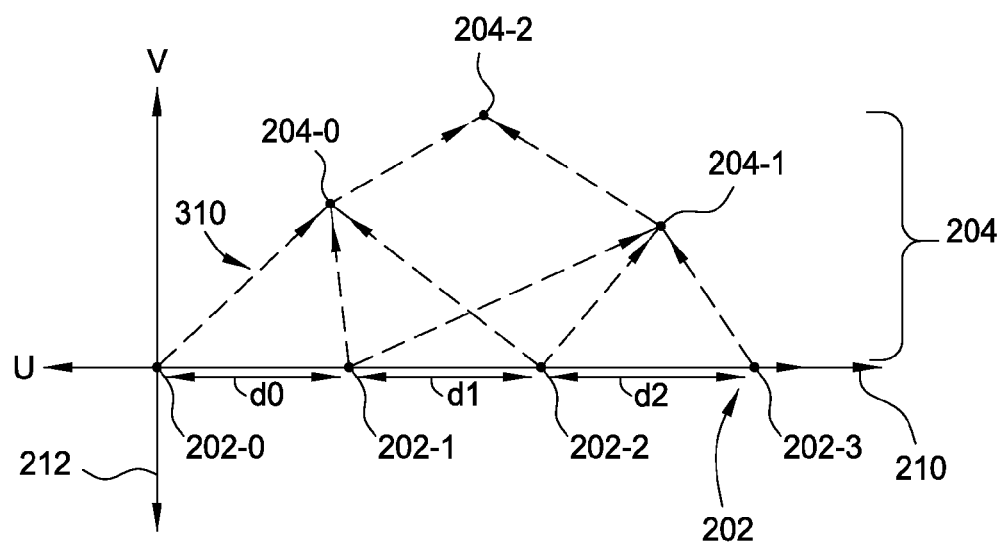
FIG. 3B is a conceptual diagram that illustrates the geodesic trace shown in FIG. 2B in greater detail, according to one embodiment of the present invention.

With stroke 202 and geodesic trace 204 parameterized in this fashion, stroke parameterization engine 114 is configured to generate a UV coordinate for each vertex associated with stroke 202 and geodesic trace 204. Referring back now to FIG. 2A, stroke parameterization engine 114 may then project texture 112 onto geodesic trace 204 along stroke 202 using those generated UV coordinates, as is shown. FIGS. 3A-3B discuss one exemplary technique for generating UV coordinates for the points associated with stroke 202 and geodesic trace 204, according to an embodiment of the present invention.

FIG. 3A is a conceptual diagram that illustrates stroke 202 and geodesic trace 204 of FIG. 2A in greater detail, according to one embodiment of the invention. As shown, stroke 202 is a polyline that includes points 202-0, 202-1, 202-2, and 202-3. Points 202-1 and 202-0 are separated by a distance d0, points 202-1 and 202-2 are separated by a distance d1, and points 202-2 and 202-3 are separated by a distance d2. As also shown, geodesic trace 204 includes points 204-0, 204-1, and 204-2. The points included within stroke 202 and geodesic trace 204 generally are associated with surface (XYZ) coordinates that define a 3D position on the surface of 3D model 110. Stroke parameterization engine 114 is configured to generate a UV coordinate for each point associated with stroke 202 and geodesic trace 204 by parameterizing those points with UV coordinates associated with texture map 112, as mentioned above in conjunction with FIGS. 2A-2B and also discussed in greater detail below in conjunction with FIG. 3B.

FIG. 3B is a conceptual diagram that illustrates stroke 202 and geodesic trace 204 of FIG. 3A parameterized with UV coordinates, according to one embodiment of the present invention. As shown, stroke 202 and geodesic trace 204 are parameterized along U axis 210 and V axis 212 associated with texture map 112, in similar fashion as shown in FIG. 2B. Stroke parameterization engine 114 is configured to parameterize stroke 202 along U axis 210 so that points 202-0, 202-1, 202-3, and 202-4 maintain similar linear distances between one another as those shown in FIG. 3A. Additionally, stroke parameterization engine 114 is configured to parameterize points 204-0, 204-1, and 204-2 by generating UV coordinates for each of those points.

Stroke parameterization engine 114 may generate the UV coordinate for a given point with geodesic trace 204 by averaging UV coordinate estimates generated for the given point relative to a set of neighboring points. For example, stroke parameterization engine 114 could generate the UV coordinate for point 204-0 by averaging UV coordinate estimates generated relative to each of points 202-0, 202-1, and 202-2. Stroke parameterization engine 114 is configured to generate a UV coordinate estimate for a given point relative to another point by implementing a "tangent-normal frame" approach, described in greater detail below in conjunction with FIG. 4.

Figure 4:
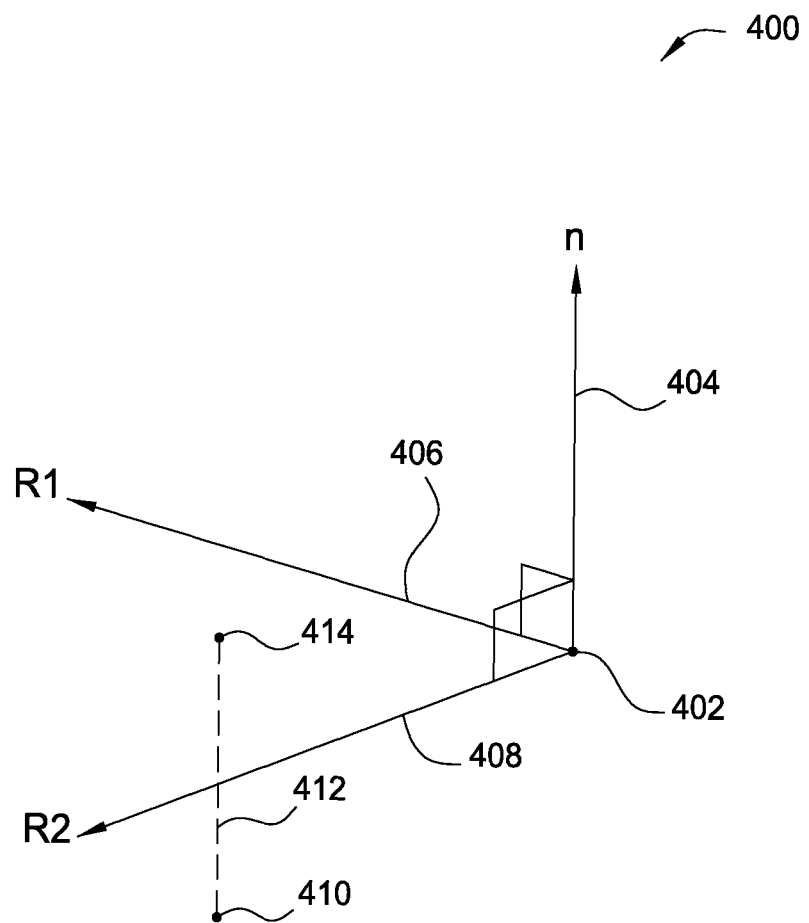
FIG. 4 is a conceptual diagram that illustrates a point projected into the tangent-normal frame associated with another point, according to one embodiment of the present invention.

FIG. 4 is a conceptual diagram that illustrates a point 410 projected into a tangent-normal frame 400 associated with another point 402, according to one embodiment of the present invention. As shown, point 402 resides at the origin of tangent-normal frame 400. Tangent-normal frame 400 includes normal vector 404 that indicates a direction normal to point 402 on the surface of 3D model 110. R1 Axis 406 and R2 axis 408 both reside orthogonal to normal vector 404 and orthogonal to one another. R1 Axis 406 and R2 axis 408 define a plane that resides tangent to point 402 on the surface of 3D model 110. Stroke parameterization engine 114 is configured to compute tangent-normal frame 400 for point 402 using any technically feasible approach to computing tangent-normal frames on the surface of 3D models.

Point 402 may be a point within stroke 202 or a point within geodesic trace 204. In general, in the example discussed herein, point 402 is a point for which stroke parameterization engine 114 has already generated a UV coordinate. Stroke parameterization engine 114 is configured to generate a UV coordinate estimate for point 410 based on the already-generated UV coordinate of point 402 and based on tangent-normal frame 400. In doing so, stroke parameterization engine 114 is configured to project point 410 into the plane defined by axes 406 and 408 along path 412 to a position 414. Stroke parameterization engine 114 could use any geometrically or mathematically feasible technique for projecting point 410 into the plane defined by axes 406 and 408.

Position 414 is generally associated with an R1 coordinate that represents the distance of position 414 along R1 axis 406 and an R2 coordinate that represents the distance of position 414 along R2 axis 408. Stroke parameterization engine 114 is configured to generate the UV coordinate estimate for point 410 by adding the R1 coordinate associated with position 414 to the U coordinate already generated for point 402, and adding the R2 coordinate associated with position 414 to the V coordinate already generated for point 402. In this fashion, stroke parameterization engine 114 may generate a UV coordinate estimate a given point relative to another point for which a UV coordinate has already been generated.

Referring back now to FIG. 3B, stroke parameterization engine 114 may implement the "tangent-normal frame" approach discussed above in conjunction with FIG. 4 to generate UV coordinates for any of the points within stroke 204 relative to a set of neighboring points. For example, once stroke parameterization engine 114 has generated UV coordinates for points 202-0, 202-1, and 202-3 included within stroke 202, stroke parameterization engine 114 may generate UV coordinate estimates for point 204-0 relative to points 202-0, 202-1, and 202-2. In doing so, stroke parameterization engine 114 could generate a different UV coordinate estimate for point 204-0 relative to each of one points 202-0, 202-1, and 202-2 by projecting point 204-0 into the tangent-normal frames associated with those points. Stroke parameterization engine 114 could then average the UV coordinate estimates generated relative to points 202-0, 202-1 and 202-2 in order to generate a UV coordinate for point 204-0.

Once stroke parameterization engine 114 has generate a UV coordinate for a given point (such as point 204-0 discussed in the previous example) by averaging UV coordinate estimates generated relative to neighboring points, stroke parameterization engine 114 may then generate a tangent-normal frame for the given point relative to the tangent-normal frames associated with those neighboring points. Returning now to the previous example, once stroke parameterization engine 114 has generated the UV coordinate for point 204-0, stroke parameterization engine 114 may compute a tangent-normal frame for point 204-0 as the tangent-normal frame having minimal total rotation relative to the tangent-normal frames associated with points 202-0, 202-1, and 202-2. Conceptually, stroke parameterization engine 114 is configured to compute a tangent-normal frame for a given point as that having an angular position "between" the angular positions associated with the tangent-normal frames associated with neighboring points.

In one embodiment, stroke parameterization engine 114 may compute a tangent-normal frame for a given point by computing the minimal rotation from each separate neighboring point, applying this rotation to a normal vector and R1 axis of that neighboring point, and then averaging the normal vectors/R1 axes associated with each different neighbor. Stroke parameterization engine 114 may then compute an R2 axis for the given point as orthogonal to the computed R1 axis, and may then re-compute the R1 axis for the given point as orthogonal to the computed normal vector and R2 axis. Persons skilled in the art will recognize that other approaches for computing "minimal rotation" also fall within the scope of the present invention.

Once stroke parameterization engine 114 has computed a tangent-normal frame for a given point, stroke parameterization engine 114 may then compute a UV coordinate estimate for a point residing adjacent to that point based on the newly-compute tangent normal frame. For example, once stroke parameterization engine 114 computed a tangent-normal frame for point 204-0, as discussed, stroke parameterization engine 114 may generate a UV coordinate estimate for point 204-2 based on that tangent-normal frame.

Conceptually, stroke parameterization engine 114 is configured to propagate UV coordinate estimates, as well as tangent-normal frames, outwards from stroke 202 along propagation lines 310. For a given point, stroke parameterization engine 114 averages the UV coordinate estimates propagated to the given point to generate the UV coordinate for that point. Likewise, stroke parameterization engine 114 computes a tangent-normal frame for the given point based on the tangent-normal frames propagated to that point.

By implementing the general approach described in conjunction with FIGS. 2A-4, stroke parameterization engine 114 is configured to propagate both UV coordinate estimates, as well as tangent normal frames, outwards from stroke 202 to points 204 within geodesic trace 204. Accordingly, stroke parameterization engine 114 is capable of generating a UV coordinate for each point included within stroke 202 and geodesic trace 204. Stroke parameterization engine 114 may then project texture 112 shown in FIGS. 1 and 2A onto geodesic trace 204 along stroke 202 using those UV coordinates. The approach described above in conjunction with FIGS. 2A-4 is described in greater detail below in conjunction with FIGS. 7-8.

Stroke parameterization engine 114 is also configured to generate a 3D model of a stroke and associated geodesic trace in order to project a texture map onto the stroke along the geodesic trace in situations where portions of that stroke overlap other portions of the stroke, as discussed in greater detail below in conjunction with FIGS. 5A-5B.

Figure 5A:
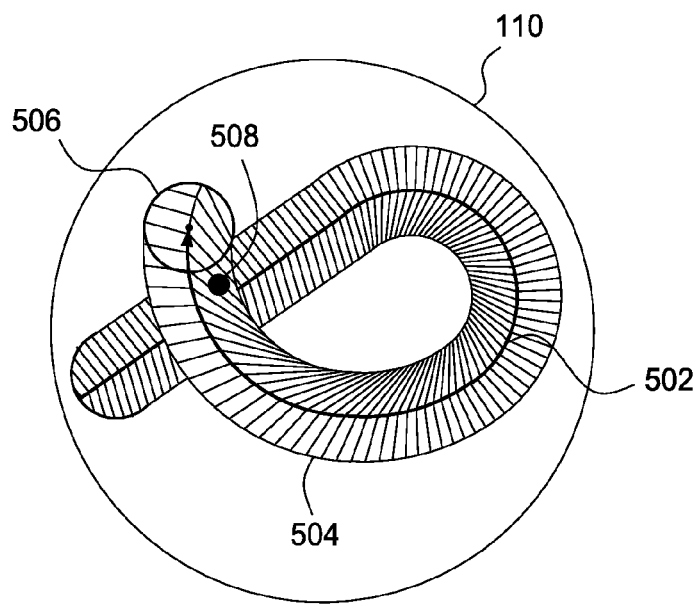
FIG. 5A is a conceptual diagram that illustrates a texture map projected onto a geodesic trace on the surface of a 3D model, according to one embodiment of the present invention.

FIG. 5A is a conceptual diagram that illustrates texture map 112 shown in FIG. 2A projected onto a geodesic trace 506 on the surface of 3D model 110 (also shown in FIG. 2A), according to one embodiment of the present invention. As shown, stroke 502 is disposed on the surface of 3D model 110. Similar to stroke 202 shown in FIG. 2A, stroke 502 defines a 3D polyline that follows a geodesic associated with the surface of 3D model 110, and geodesic trace 504 defines a region proximate to stroke 502. The end-user of rendering engine 108 may interact with the GUI provided by rendering engine 108 in order to draw or paint stroke 502 on the surface of 3D model 110. Stroke parameterization engine 114 is configured to project texture 112 onto geodesic trace 504 along stroke 502 by implementing a modified version of the technique discussed above in conjunction with FIGS. 2A-4. Stroke parameterization engine 114 may implement this modified technique in order to perform stroke parameterization and texture mapping in situations where portions of a stroke intersect other portions of that stroke.

In the example illustrated in FIG. 5A, portions of stroke 502 intersect other portions of that stroke 502, and, likewise, portions of geodesic trace 504 intersect other portions of that geodesic trace 504. Accordingly, specific regions of 3D model 110 residing within those intersecting portions may be associated with more than one different portion of geodesic trace 504. For example, point 508-0 may be included within a "tail" portion of geodesic trace 504, while that same point 508-0 may also be included within a "head" portion of geodesic trace 504 (proximate to geodesic circle 506) that overlaps the tail portion. Consequently, stroke parameterization engine 114 may not be able to determine a unique UV coordinate for point 508 because that point resides in different regions of geodesic trace 504 relative to stroke 502. Specifically, point 508 resides above stroke 502 within the tail portion of geodesic trace 504, yet resides below stroke 502 within the head portion of geodesic trace 504. Thus, stroke parameterization engine 114 may not be able to generate a unique UV coordinate for point 508. Stroke parameterization engine 114 is configured to resolve this issue by generating a 3D model of stroke 502 and geodesic trace 504, referred to hereinafter as a "stroke model". The stroke model includes one or more copies of points within 3D model 110 that fall within stroke 502 or geodesic trace 504, as further described below.

Stroke parameterization engine 114 is configured to generate the stroke model by placing geodesic circle 506 at sequential locations along stroke 502. For each such location, stroke parameterization engine 114 identifies a set of points associated with 3D model 110 that are included within geodesic circle 506. Stroke parameterization engine 114 slides geodesic circle 506 incrementally in this fashion along stroke 502, and for each identified set of points, stroke parameterization engine 114 determines a subset of points that were not included within the previous set of points (i.e. the points included within geodesic circle 506 at a previous location along stroke 502). Stroke parameterization engine 114 collects each subset of points determined in this fashion to the stroke model. As a result, stroke parameterization engine 114 generates at least one copy of each point within stroke 502 and geodesic trace 504, and may also generate multiple copies of points residing within self-intersecting portions of stroke 502. Stroke parameterization engine 114 may then perform the stroke parameterization and texture mapping approach described above in conjunction with FIGS. 2A-4 using the stroke model, as further described below in conjunction with FIG. 5B.

Figure 5B:
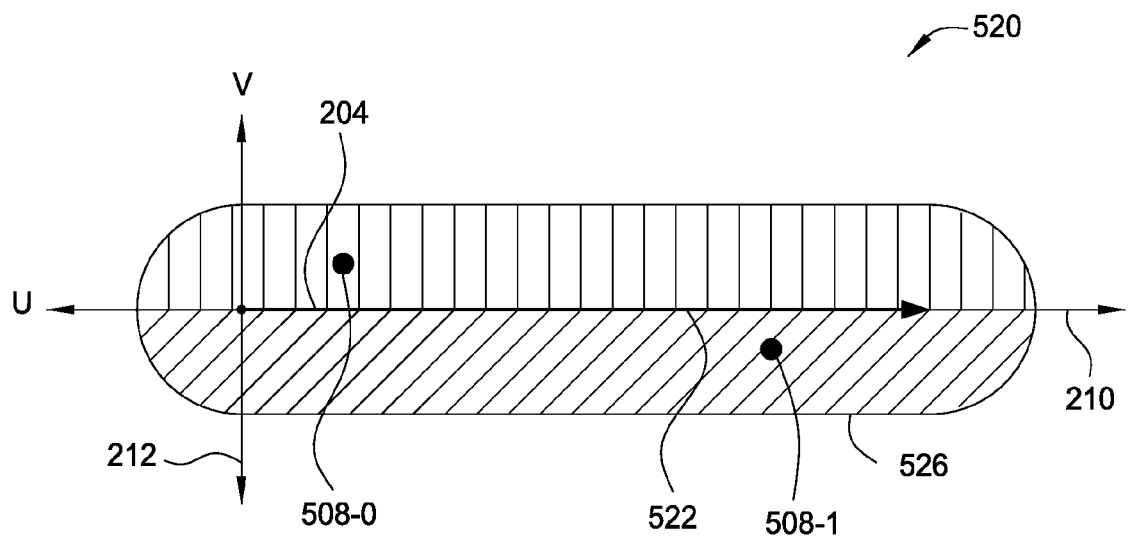
FIG. 5B is a conceptual diagram that illustrates a stroke model parameterized with UV coordinates, according to one embodiment of the present invention.

FIG. 5B is a conceptual diagram that illustrates a stroke model 520 parameterized with UV coordinates, according to one embodiment of the invention. As shown, stroke model 520 includes stroke 522 and geodesic trace 524. Stroke 522 and geodesic trace 524 generally correspond to stroke 502 and geodesic trace 504 shown in FIG. 5A. However, stroke 522 and geodesic trace 524 may include additional copies of points included within stroke 502 and/or geodesic trace 504.

For example, geodesic trace 504 includes point 508 that resides within an intersecting region of geodesic trace 504, as previously discussed by way of example in conjunction with FIG. 5A. Similarly, geodesic trace 524 includes points 508-0 and 508-1 that represent copies of point 508. Stroke parameterization engine 114 is configured to copy point 508-0 from the "tail" region of geodesic trace 504, and, thus, from a position above stroke 502 within geodesic trace 504. In like fashion, stroke parameterization engine 114 is configured to copy point 508-1 from the "head" region of geodesic trace 504, and, thus, from a position below stroke 502 within geodesic trace 504. As is shown, stroke parameterization engine 114 may then assign unique UV coordinates to each different copy of point 508.

In general, with the approach described above in conjunction with FIGS. 5A-5B, stroke parameterization engine 114 is configured to generate one or more copies of points associated with 3D model 110 that fall within stroke 502 or geodesic trace 504. Stroke parameterization engine 114 may generate more than one copy of points residing within more than one portion of stroke 502 or geodesic trace 504. Stroke parameterization engine 114 may then perform the stroke parameterization and texture mapping approach described above in conjunction with FIGS. 2A-4 using this newly generated stroke model. The approach described above in conjunction with FIGS. 5A-5B is discussed in greater detail below in conjunction with FIG. 9. Stroke parameterization engine 114 may also be configured to identify specific types of features associated with 3D model 110, as described in greater detail below in conjunction with FIGS. 6A-6B.

Figure 6A:
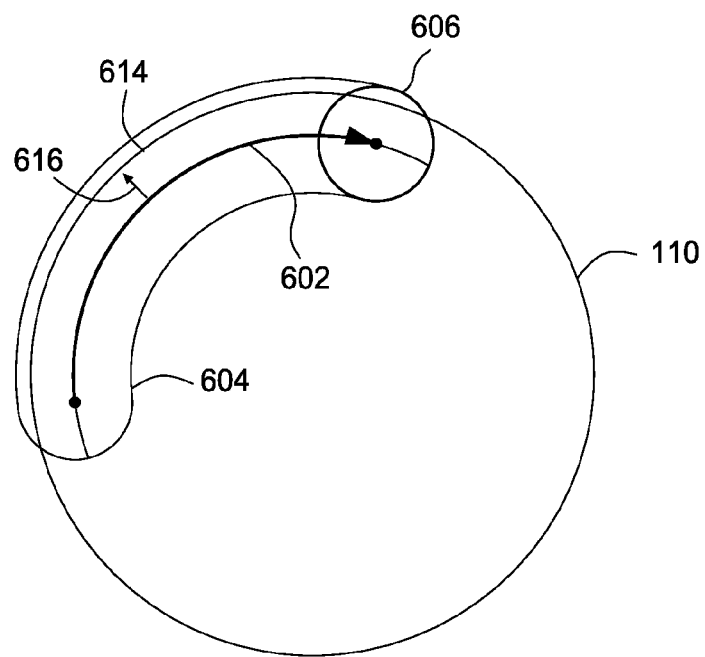
FIG. 6A is a conceptual diagram that illustrates a geodesic trace that includes a feature associated with a 3D model, according to one embodiment of the present invention.

FIG. 6A is a conceptual diagram that illustrates a geodesic trace 604 that includes a feature 614 associated with 3D model 110, according to one embodiment of the present invention. As shown, a stroke 602 is disposed on the surface of 3D model 110. Stroke parameterization engine 114 is configured to generate geodesic trace 604 that defines a region proximate to stroke 602 by sliding geodesic circle 606 along stroke 602, in similar fashion as previously discussed in conjunction with FIGS. 2A-5B. Stroke parameterization engine 114 is also configured to parameterize various points associated with 3D model 110 that reside within geodesic trace 604, including points associated with stroke 602 as well as points associated with feature 614. Feature 614, could be, for example, an edge or crease associated with 3D model 110. Upon parameterizing the points associated with 3D model 110 that reside within geodesic trace 604, stroke parameterization engine 114 is configured to identify feature 614 and to then relocate stroke 602 along path 616 to a position approximately collinear with feature 614, as discussed in greater detail below in conjunction with FIG. 6B.

Figure 6B:
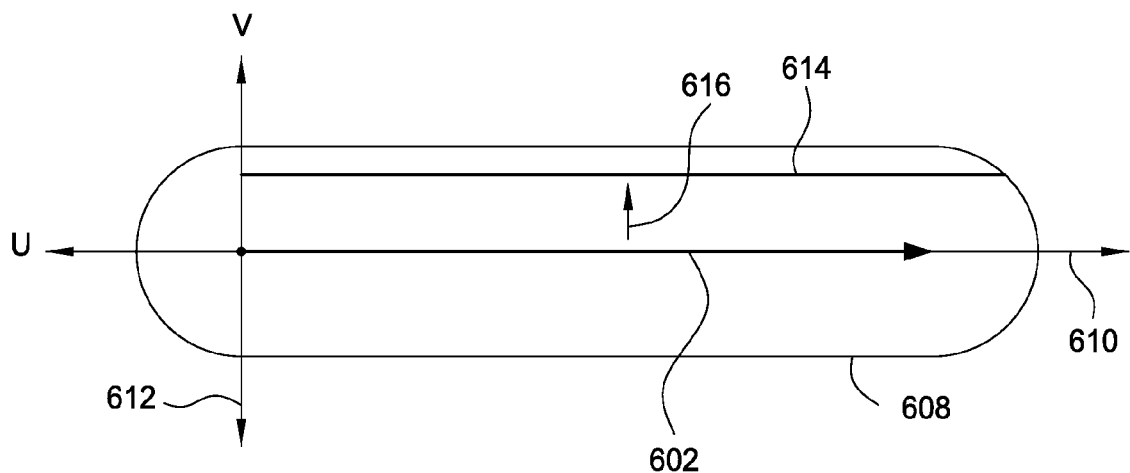
FIG. 6B is a conceptual diagram that illustrates the geodesic trace shown in FIG. 6A parameterized with UV coordinates, according to one embodiment of the present invention.

FIG. 6B is a conceptual diagram that illustrates stroke 602 and geodesic trace 604 shown in FIG. 6B parameterized with UV coordinates, according to one embodiment of the present invention. As shown, stroke 602 and geodesic trace 604 are parameterized along U axis 610 and V axis 612. Stroke parameterization engine 114 is configured to parameterize stroke 602 so that stroke 602 resides along U axis 610. Stroke parameterization engine 114 is configured to parameterize geodesic trace 604 in similar fashion, i.e. along U axis 610. Likewise, stroke parameterization engine 114 is configured to parameterize feature 614 along U axis 610. Stroke parameterization engine 114 is configured to identify various points of 3D model 110 included within feature 614 by computing a particular metric for each point included within geodesic trace 604, and then identifying a sequence of points that maximize or minimize that metric.

For example, in the example discussed herein, feature 614 could represent the edge of 3D model 110. Stroke parameterization engine 114 could identify feature 614 by computing a metric that reflects the change in Z-depth between adjacent points associated with 3D model 110 included within geodesic trace 604. Stroke parameterization engine 114 could then identify feature 614 as the set of points associated with 3D model 110 that have a maximum change in Z-depth relative to adjacent points. Stroke parameterization engine 114 may then relocate stroke 602 along path 616 to a position approximately collinear with feature 614, as shown in FIG. 6B. Stroke parameterization engine 114 may then project stroke 602 onto 3D model 110 at the new position.

With this approach, stroke parameterization engine 114 is configured to parameterize a geodesic trace proximate to a user-defined stroke in order to identify particular features associated with 3D model 110. Stroke parameterization engine 114 may also be configured to identify other types of features, such as creases, corners, curves, lines, and so forth. The technique implemented by stroke parameterization engine 114 for identifying features is discussed in greater detail below in conjunction with FIG. 10.

Figure 7:
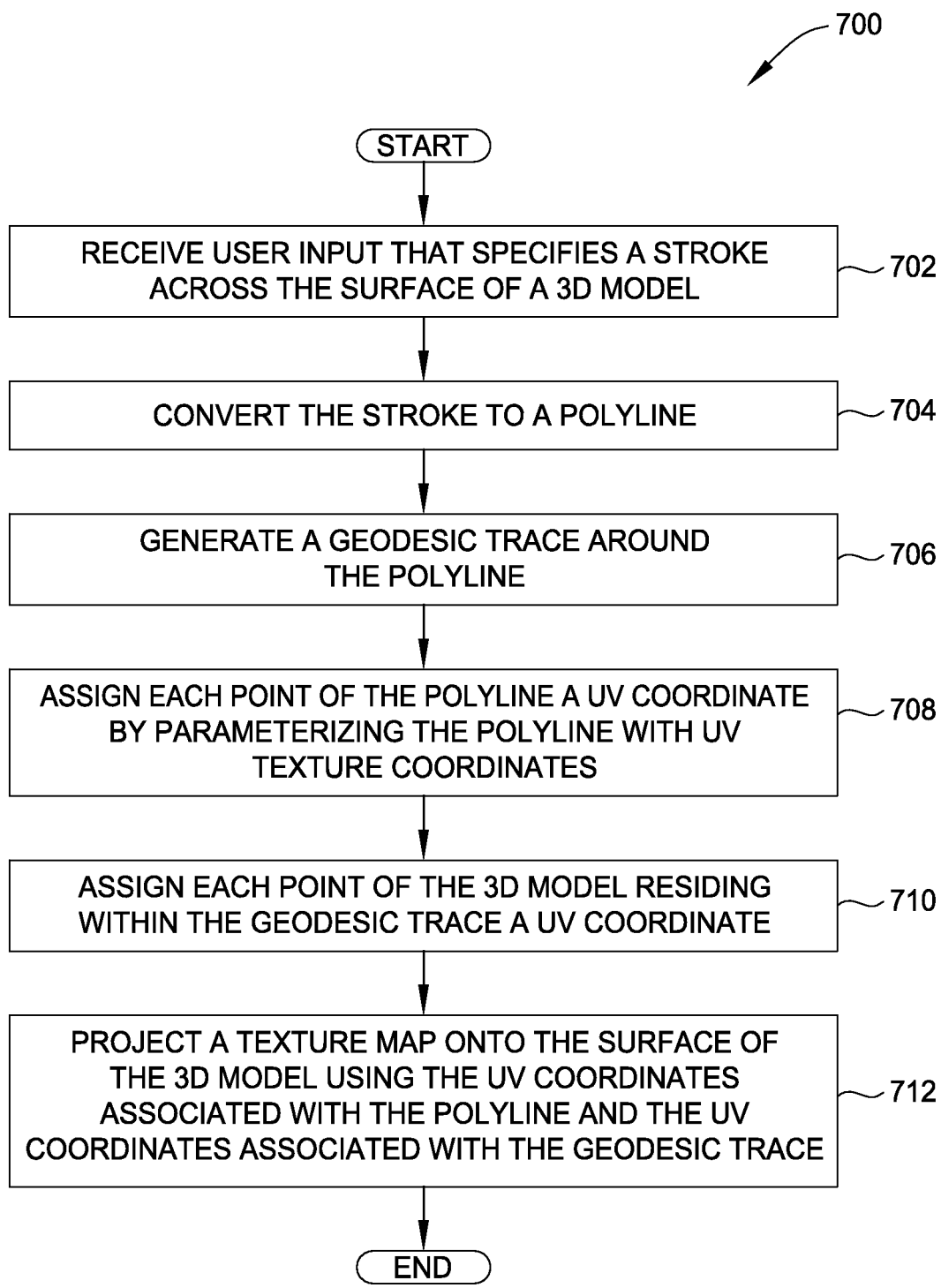
FIG. 7 is a flow diagram of method steps for projecting a texture map onto a geodesic trace on the surface of a 3D model, according to one embodiment of the present invention.

FIG. 7 is a flow diagram of method steps for projecting a texture map onto a geodesic trace on the surface of a 3D model, according to one embodiment of the present invention. Although the method steps are described in conjunction with the system of FIG. 1, persons skilled in the art will understand that any system configured to perform the method steps, in any order, is within the scope of the present invention.

As shown, a method 700 begins at step 702, where stroke parameterization engine 114 receives input from an end-user of rendering engine 108 that specifies a stroke across the surface of a 3D model. The 3D model could be, for example, 3D model 110 shown in FIGS. 1-3B and 5A-6B. Stroke parameterization engine 114 may receive input from the end-user specifying the stroke via a GUI generated by rendering engine 108 shown in FIG. 1. The GUI could, for example, expose various controls to the end-user, including drawing tools and other such tools. The end-user could draw or paint a stroke across the surface of the 3D model using those tools.

At step 704, stroke parameterization engine 114 converts the stroke to a 3D polyline. The 3D polyline may include one or different points, such as, e.g. points 202-0, 202-1, 202-2, and 202-3 shown in FIG. 3A. At step 706, stroke parameterization engine 114 generates a geodesic trace around the polyline that defines a region proximate to the polyline. The geodesic trace could be, for example, geodesic trace 204 shown in FIGS. 2A-3B and 5A-6B. Stroke parameterization engine 114 may generate the geodesic placing a geodesic circle at each sequential point within the polyline and identifying portions of the 3D model (such as, e.g., vertices or points, etc.) that fall within the geodesic circle. The geodesic circle may be a 2D circle that resides tangent to the surface of the 3D model at different points within the polyline.

At step 708, stroke parameterization engine 114 assigns each point within the polyline a UV coordinate associated with a texture map, such as texture map 112 shown in FIGS. 1-2A. Stroke parameterization engine 114 may perform step 708 by parameterizing the polyline with UV coordinates associated with the texture map, in similar fashion as described above in conjunction with FIG. 2B. At step 710, stroke parameterization engine 114 assigns each point within the geodesic trace a UV coordinate based on the UV coordinates assigned to points within the polyline and also based on tangent-normal frames associated with those points. One exemplary technique that may be implemented by stroke parameterization engine 114 when performing step 708 is described in greater detail below in conjunction with FIG. 8.

At step 712, stroke parameterization engine 114 projects the texture map onto the surface of the 3D model using the UV coordinates associated with the polyline and the UV coordinates associated with the geodesic trace. The method 700 then ends. One technique for performing step 710 of the method 700 is described in greater detail below in conjunction with FIG. 8.

Figure 8:
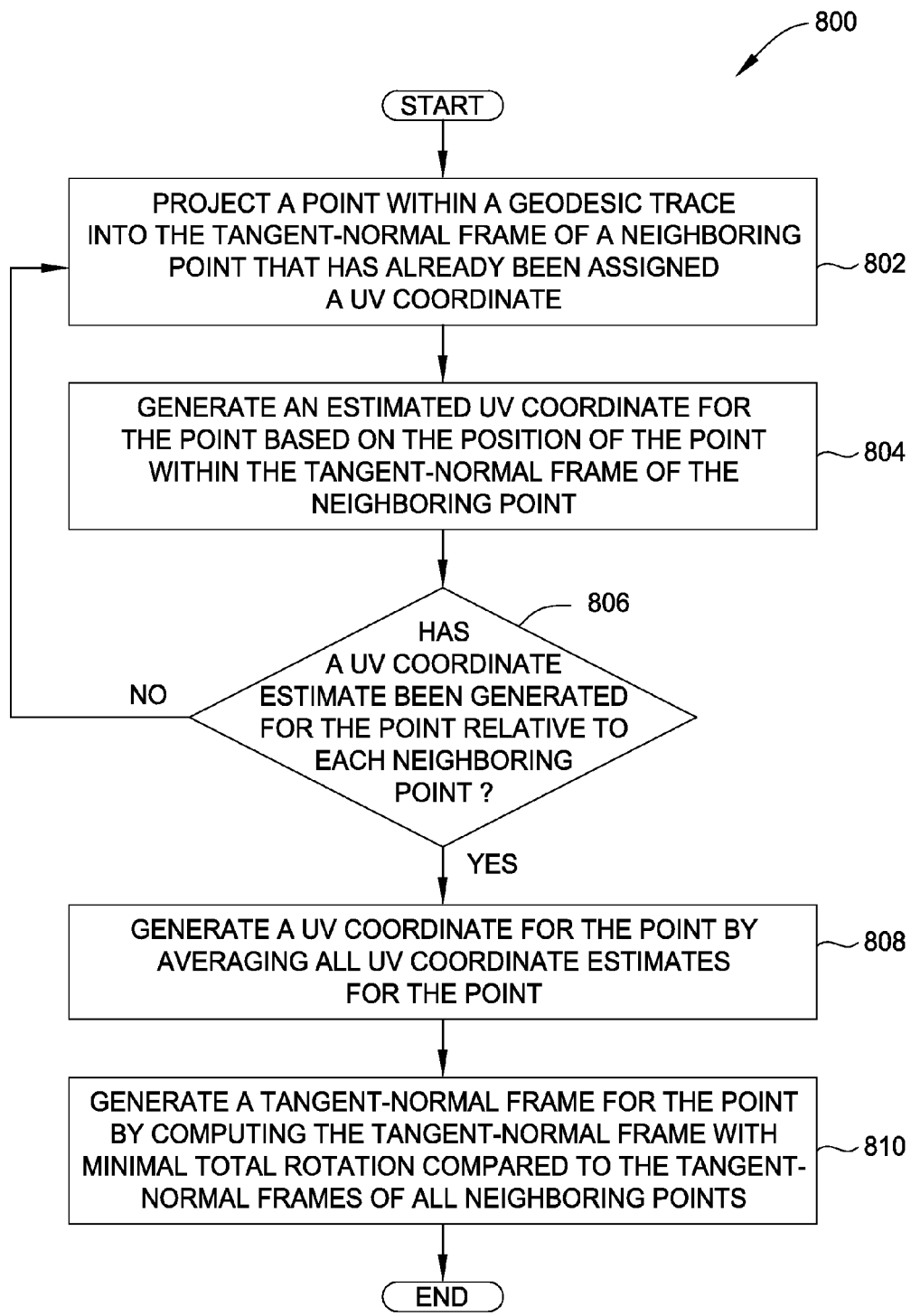
FIG. 8 is a flow diagram of method steps for determining a UV coordinate for a point within a geodesic trace on the surface of a 3D model, according to one embodiment of the present invention.

FIG. 8 is a flow diagram of method steps for determining a UV coordinate for a point within a geodesic trace on the surface of a 3D model, according to one embodiment of the present invention. Although the method steps are described in conjunction with the system of FIG. 1, persons skilled in the art will understand that any system configured to perform the method steps, in any order, is within the scope of the present invention.

As shown, a method 800 beings at step 802 where stroke parameterization engine 114 projects a point within a geodesic trace into the tangent normal frame of a neighboring point that has already been assigned a UV coordinate. The point may be included within a polyline associated with a user-generated stroke, and stroke parameterization engine 114 could have assigned the UV coordinate to the point by performing step 708 of the method 700 described above in conjunction with FIG. 7. The point could also be any point residing within the geodesic trace that has already been assigned a UV coordinate by stroke parameterization engine 114.

Stroke parameterization engine 114 may generate the tangent normal frame for the neighboring point by computing a normal vector originating at the neighboring point and normal to the surface of the 3D model, as well as two additional vectors orthogonal to the normal vector and orthogonal to one another, similar to tangent normal frame 402 shown in FIG. 4. Stroke parameterization engine 114 may project the point into the tangent-normal frame of the neighboring point by implementing the approach described above in conjunction with FIG. 4.

At step 804, stroke parameterization engine 114 generates an estimated UV coordinate for the point based on the position of the point within the tangent-normal frame of the neighboring point. Stroke parameterization engine 114 could, for example, add each position coordinate of the point within the tangent-normal frame of the neighboring point to corresponding U and V coordinates already assigned to the neighboring point, thereby generating a UV coordinate estimate for the point relative to the neighboring point.

At step 806, stroke parameterization engine 114 determines whether a UV coordinate estimate has been generated for the point relative to each neighboring point. Stroke parameterization engine 114 may identify neighboring points by determining the set of points residing within a threshold distance of the point. If stroke parameterization engine 114 determines that a UV coordinate estimate has not been generated for the point relative to each neighboring point, then the method 800 returns to step 802 and proceeds as described above. Otherwise, if stroke parameterization engine 114 determines that a UV coordinate estimate has been generated for the point relative to each neighboring point, then the method 800 proceeds to step 808.

At step 808, stroke parameterization engine 114, generates a UV coordinate for the point by averaging all UV coordinate estimates generated for the point relative to all neighboring points. At step 810, stroke parameterization engine 114 generates a tangent-normal from for the point by computing a tangent-normal frame having minimal rotation compared to the tangent-normal frames of all neighboring points. Conceptually, stroke parameterization engine 114 is configured to compute a tangent-normal frame for the point having an angular position that is "between" the angular positions associated with the tangent-normal frames associated with all neighboring points. The method 800 then ends.

Stroke parameterization engine 114 may perform the method 800 iteratively for each point within the geodesic trace. Stroke parameterization engine 114 may also perform the method 800 sequentially, starting with points residing adjacent to the polyline and moving outwards (e.g., along propagation lines 310 shown on FIG. 3B) towards points residing adjacent to the edges of the geodesic trace, as described above in conjunction with FIGS. 3A-3B. Stroke parameterization engine 114 is also configured to project a texture map onto a self-intersecting stroke, as described in greater detail below in conjunction with FIG. 9.

Figure 9:
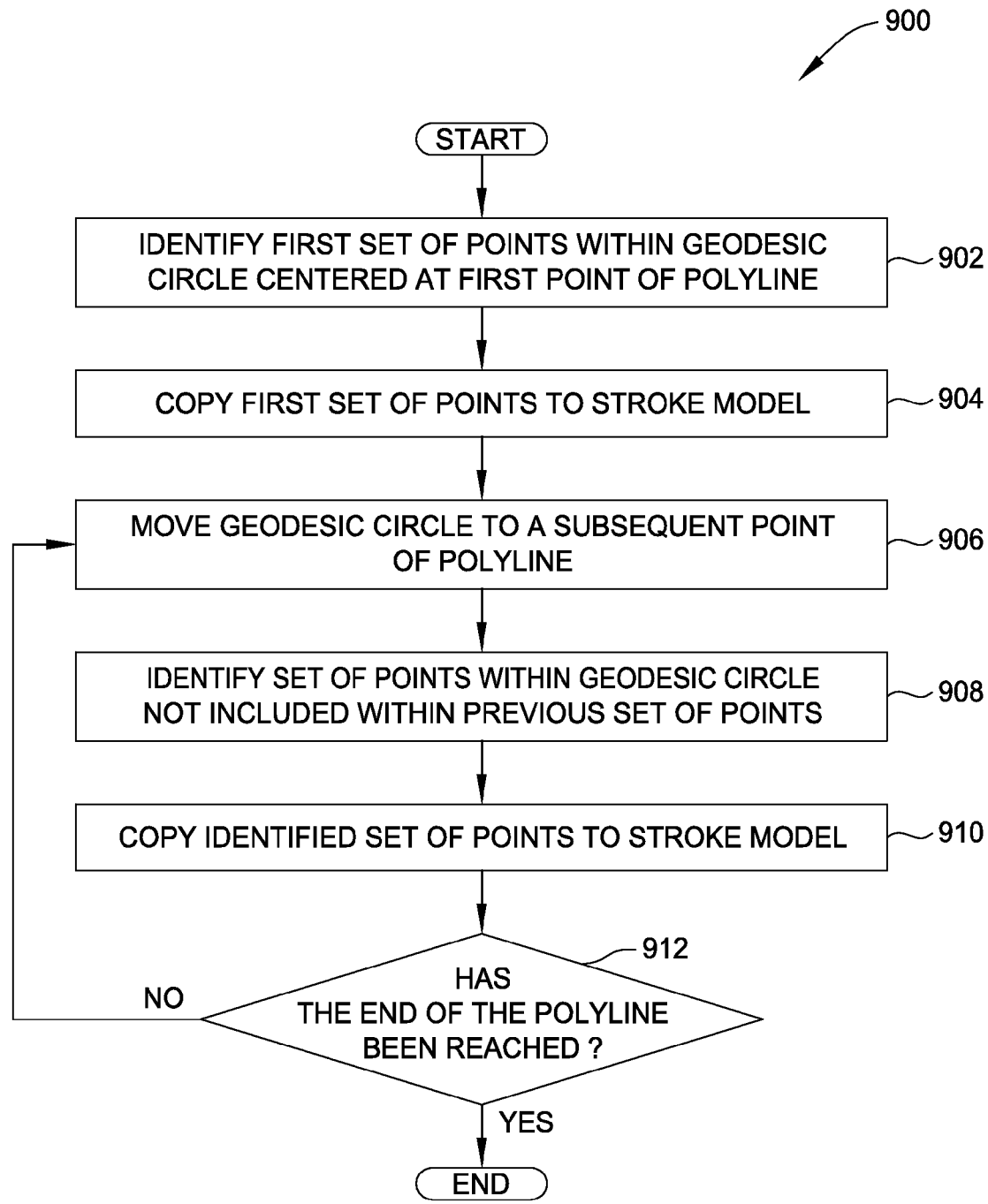
FIG. 9 is a flow diagram of method steps for generating a stroke model, according to one embodiment of the present invention.

FIG. 9 is a flow diagram of method steps for generating a stroke model, according to one embodiment of the present invention. Although the method steps are described in conjunction with the system of FIG. 1, persons skilled in the art will understand that any system configured to perform the method steps, in any order, is within the scope of the present invention.

As shown, a method 900 begins at step 902, where stroke parameterization engine 114 identifies a first set of points within a geodesic circle centered at a first point within a polyline associated with a stroke on the surface of a 3D model. The stroke could be specified by an end-user, similar to step 702 described above in conjunction with FIG. 7. The points could be vertices, points, or other portions of a 3D model. At step 904, stroke parameterization engine 114 copies the first set of points to a stroke model. The stroke model is generally a 3D model that includes the stroke and points residing adjacent to the stroke.

At step 906, stroke parameterization engine 114 moves the geodesic circle to a subsequent point associated with the polyline. At step 908, stroke parameterization engine 114 identifies a set of points within the geodesic circle that were not included within the previous set of points, i.e. the points within the geodesic circle when positioned at the previous point associated with the polyline. At step 910, stroke parameterization engine 114 copies the points identified at step 910 to the stroke model. At step 912, stroke parameterization engine 114 determines whether the end of the polyline has been reached. If stroke parameterization engine 114 determines that the end of the polyline has not been reached, then the method 900 returns to step 906 and proceeds as described above. If stroke parameterization engine 114 determines that the end of the polyline has been reached, then the method 900 ends.

By implementing the method 900, stroke parameterization engine 114 is capable of avoiding potentially problematic situations that may be caused by a self-intersecting stroke, as previously described above in conjunction with FIGS. 5A-5B. Once stroke parameterization engine 114 has generated the stroke model, stroke parameterization engine 114 may then implement the method 700 described above in conjunction with FIG. 7 in order to project a texture map onto the stroke model. Stroke parameterization engine 114 may also parameterize a stroke in order to identify a particular feature associated with the 3D model, as described above in conjunction with FIGS. 6A-6B and described in greater detail below in conjunction with FIG. 10.

Figure 10:
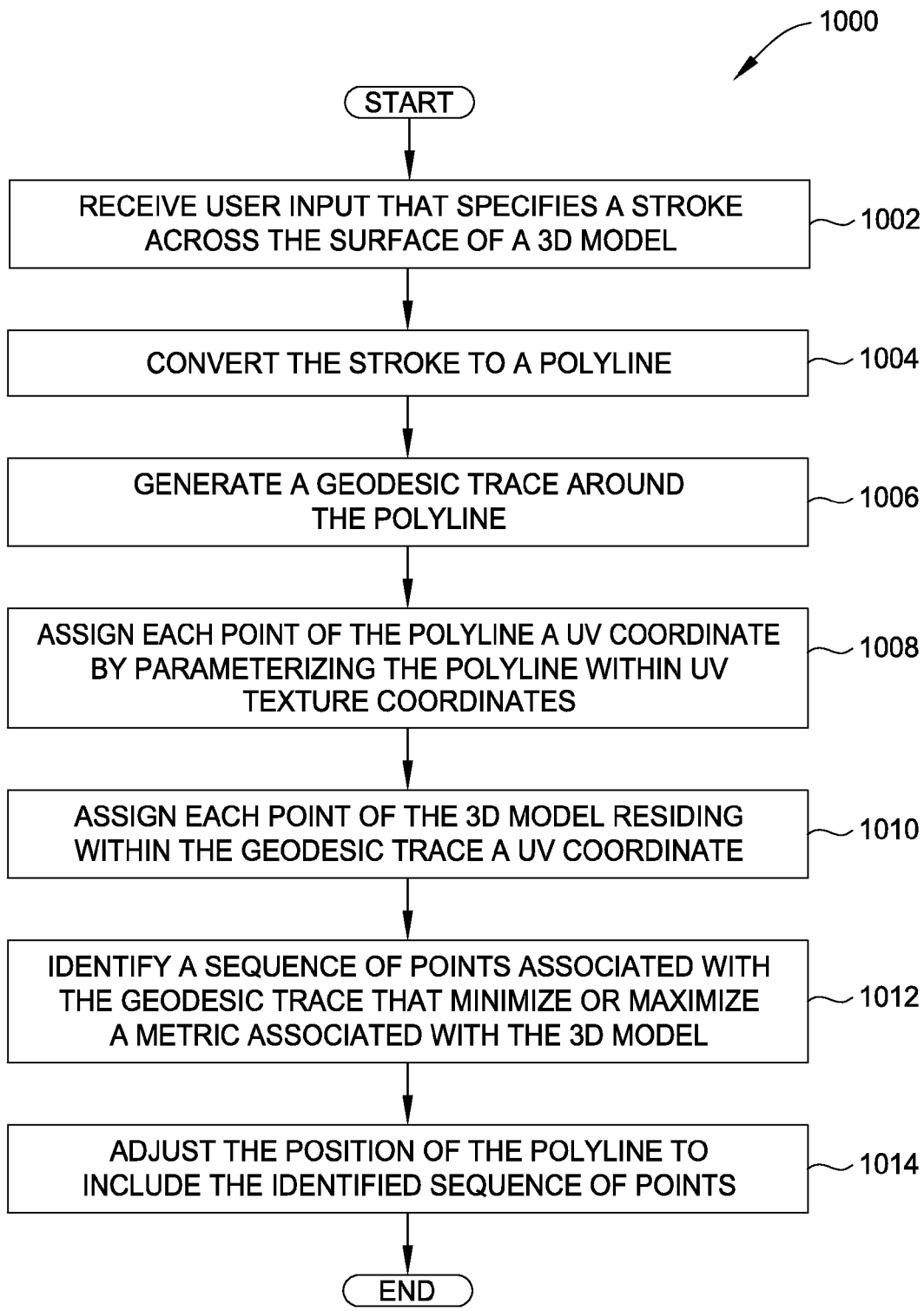
FIG. 10 is a flow diagram of method steps for identifying a feature of a 3D model that resides within a geodesic trace on the surface of the 3D model, according to one embodiment of the present invention.

FIG. 10 is a flow diagram of method steps for identifying a feature of a 3D model that resides within a geodesic trace on the surface of the 3D model. Although the method steps are described in conjunction with the system of FIG. 1, persons skilled in the art will understand that any system configured to perform the method steps, in any order, is within the scope of the present invention.

As shown, a method 1000 begins at step 1002, where stroke parameterization engine 114 receives input from an end-user of rendering engine 108 that specifies a stroke across the surface of a 3D model. At step 1004, stroke parameterization engine 114 converts the stroke to a 3D polyline. At step 1006, stroke parameterization engine 114 generates a geodesic trace around the polyline that defines a region proximate to the polyline. At step 1008, stroke parameterization engine 114 assigns each point within the polyline a UV coordinate associated with a texture map. At step 1010, stroke parameterization engine 114 assigns each point within the geodesic trace a UV coordinate based on the UV coordinates assigned to points within the polyline and also based on tangent-normal frames associated with those points. Steps 1002, 1004, 1006, 1008, and 1010 of the method 1000 may be similar to steps 702, 704, 706, 708, and 710, respectively, of the method 700 described above in conjunction with FIG. 7.

At step 1012, stroke parameterization engine 114 identifies a sequence of points associated with the geodesic trace that minimize or maximize a given metric. For example, the metric could reflect a change in Z-depth between adjacent points associated with the 3D model and included within the geodesic trace. At step 1012, stroke parameterization engine 114 could then identify a sequence of points associated with the geodesic trace that have a maximum change in Z-depth relative to adjacent points. That sequence of points could represent a feature, such as an edge, of the 3D model. As discussed above in conjunction with FIGS. 6A-6B, stroke parameterization engine 114 could also identify other types of features using other types of metrics.

At step 1014, stroke parameterization engine 114 adjusts the position of the polyline to include the identified sequence of points. Stroke parameterization engine 114 could, for example, move the polyline to be approximately collinear with the identified set of points. With this approach, stroke parameterization engine 114 allows an end-user to draw a stroke proximate to a feature to be identified, and to then adjust the position of that stroke to reside along the feature.

In sum, a stroke parameterization engine within a rendering engine is configured to map a texture to the surface of a three-dimensional (3D) model along a stroke defined by an end-user of the rendering engine. The stroke parameterization engine converts the stroke to a polyline, then generates a geodesic trace by sliding a geodesic circle along the polyline and collecting points associated with the 3D model that fall within the geodesic circle. The stroke parameterization engine then parameterizes points associated with the polyline and the geodesic trace using UV coordinates associated with a texture map, thereby generating UV coordinates for each point within the polyline and geodesic trace. The stroke parameterization engine then projects the texture map onto the surface of the 3D model using the UV coordinates generated for the polyline and geodesic trace.

Advantageously, the rendering engine is capable of mapping a texture across the surface of the 3D model along the stroke specified by the end-user, thereby producing a continuous-looking texture along that stroke.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A computer-implemented method for projecting a texture map onto a three-dimensional (3D) model, the method comprising:
generating a polyline that includes a first plurality of points that resides along a stroke path defined across a surface region of the 3D model;
generating a second plurality of points that resides within a threshold distance of the polyline;
generating a UV coordinate for each point included in the first plurality of points and for each point included in the second plurality of points; and
projecting the texture map onto the surface region of the 3D model according to the generated UV coordinates.

2. The computer-implemented method of claim 1, wherein the stroke path is defined across the surface region by:
receiving input that reflects a curvilinear line segment disposed on the surface region of the 3D model;
identifying a first sequence of 3D points that resides substantially collinear with the curvilinear line segment; and
including the first sequence of 3D points within the first plurality of points.

3. The computer-implemented method of claim 1, wherein generating a geodesic trace that includes the second plurality of points comprises:
at each point included in the first plurality of points, positioning a geodesic disc that resides substantially tangent to the surface region of the 3D model; and
at each point included in the first plurality of points, collecting one or more points that are included within the geodesic disc and are associated with the surface region of the 3D model.

4. The computer-implemented method of claim 1, wherein generating a UV coordinate for each point included in the first plurality of points comprises parameterizing each point included in the first plurality of points with UV coordinates associated with the texture map, and wherein generating a UV coordinate for each point included in the second plurality of points comprises parameterizing each point included in the second plurality of points with UV coordinates associated with the texture map.

5. The computer-implemented method of claim 1, wherein generating a UV coordinate for a given point included in the second plurality of points comprises:
identifying one or more neighboring points residing adjacent to the given point;
generating a set of UV coordinate estimates for the given point, wherein each UV coordinate estimate is generated based on a projected position of the given point within a tangent-normal frame associated with at least one neighboring point and a UV coordinate associated with the at least one neighboring point; and
averaging the set of UV coordinate estimates.

6. The computer-implemented method of claim 1, further comprising generating a stroke model that includes one or more copies of each point included in the first plurality of points and one or more copies of each point included in the second plurality of points.

7. The computer-implemented method of claim 6, further comprising generating the stroke model by:
positioning a geodesic disc at a first point included in the first plurality of points, wherein the geodesic disc resides substantially tangent to the surface region of the 3D model;
identifying a first set of points included in the geodesic disc;
re-positioning the geodesic disc at a second point included in the first plurality of points;
identifying a second set of points included in the geodesic disc;
identifying a third set of points that is included in the second set of points but not included in the first set of points; and
including the third set of points in the stroke model.

8. The computer-implemented method of claim 6, further comprising parameterizing each point included in the stroke model with a UV coordinate associated with the texture map to generate a UV coordinate for each point included in the stroke model.

9. The computer-implemented method of claim 8, further comprising projecting the texture map onto the surface region of the 3D model according to the UV coordinates generated for the points included in the stroke model.

10. The computer-implemented method of claim 1, further comprising receiving a painted stroke across the surface region of the 3D model that defines the stroke path.

11. A non-transitory computer-readable medium storing program instructions that, when executed by a processor, cause the processor to project a texture map onto a three-dimensional (3D) model by performing the steps of:
generating a polyline that includes a first plurality of points that resides along a stroke path defined across a surface region of the 3D model;
generating a second plurality of points that resides within a threshold distance of the polyline;
generating a UV coordinate for each point included in the first plurality of points and for each point included in the second plurality of points; and
projecting the texture map onto the surface region of the 3D model according to the generated UV coordinates.

12. The non-transitory computer-readable medium of claim 11, wherein the stroke path is defined across the surface region by:
receiving user input that reflects a curvilinear line segment disposed on the surface region of the 3D model;
identifying a first sequence of 3D points included within the surface region of the 3D model, wherein the first sequence of 3D points resides substantially collinear with the curvilinear line segment; and
including the first sequence of 3D points within the first plurality of points.

13. The non-transitory computer-readable medium of claim 11, wherein generating a geodesic trace that includes the second plurality of points comprises:
at each point included in the first plurality of points, positioning a geodesic disc that resides substantially tangent to the surface region of the 3D model; and
at each point included in the first plurality of points, collecting one or more points that are included within the geodesic disc and are associated with the surface region of the 3D model.

14. The non-transitory computer-readable medium of claim 11, wherein the step of generating a UV coordinate for each point included in the first plurality of points comprises parameterizing each point included in the first plurality of points with UV coordinates associated with the texture map, and wherein the step of generating a UV coordinate for each point included in the second plurality of points comprises parameterizing each point included in the second plurality of points with UV coordinates associated with the texture map.

15. The non-transitory computer-readable medium of claim 11, wherein generating a UV coordinate for a given point included in the second plurality of points comprises:
identifying one or more neighboring points residing adjacent to the given point;
generating a set of UV coordinate estimates for the given point, wherein each UV coordinate estimate is generated based on a projected position of the given point within a tangent-normal frame associated with at least one neighboring point and a UV coordinate associated with the at least one neighboring point; and
averaging the set of UV coordinate estimates.

16. The non-transitory computer-readable medium of claim 11, further comprising generating a stroke model that includes one or more copies of each point included in the first plurality of points and one or more copies of each point included in the second plurality of points.

17. The non-transitory computer-readable medium of claim 16, further comprising generating the stroke model by:
positioning a geodesic disc at a first point included in the first plurality of points, wherein the geodesic disc resides substantially tangent to the surface region of the 3D model;
identifying a first set of points included in the geodesic disc;
re-positioning the geodesic disc at a second point included in the first plurality of points;
identifying a second set of points included in the geodesic disc;
identifying a third set of points that is included in the second set of points but not included in the first set of points; and
including the third set of points in the stroke model.

18. The non-transitory computer-readable medium of claim 16, further comprising parameterizing each point included in the stroke model with a UV coordinate associated with the texture map to generate a UV coordinate for each point included in the stroke model.

19. The non-transitory computer-readable medium of claim 18, further comprising projecting the texture map onto the surface region of the 3D model according to the UV coordinates generated for the points included in the stroke model.

20. A computing device configured to project a texture map onto a three-dimensional (3D) model, including:
a memory that includes a stroke parameterization engine; and
a processor coupled to the memory and, when executing the stroke parameterization engine, is configured to:
generate a polyline that includes a first plurality of points that resides along a stroke path defined across a surface region of the 3D model;
generate a geodesic trace that includes a second plurality of points that resides within a threshold distance of the polyline;
generate a UV coordinate for each point included in the first plurality of points and for each point included in the second plurality of points; and
project the texture map onto the surface region of the 3D model according to the UV coordinates for each point included in the first plurality of points and the UV coordinates for each point included in the second plurality of points.

* * * * *